US006714046B2

(12) United States Patent
Fujikawa et al.

(10) Patent No.: US 6,714,046 B2
(45) Date of Patent: Mar. 30, 2004

(54) LEVEL SHIFTER AND ELECTRO-OPTICAL APPARATUS INCORPORATING THE SAME

(75) Inventors: Shinsuke Fujikawa, Suwa (JP); Tokuro Ozawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/175,427

(22) Filed: Jun. 20, 2002

(65) Prior Publication Data

US 2003/0001616 A1 Jan. 2, 2003

(30) Foreign Application Priority Data

Jun. 26, 2001 (JP) ....................................... 2001-193601
May 31, 2002 (JP) ....................................... 2002-159927

(51) Int. Cl.[7] ............................................. H03K 19/075
(52) U.S. Cl. ............................. 326/62; 326/63; 326/80; 326/88
(58) Field of Search .............................. 326/63, 68, 80, 326/81, 92, 88

(56) References Cited

U.S. PATENT DOCUMENTS 4,419,593 A * 12/1983 Butler et al. ................ 307/354
4,794,283 A * 12/1988 Allen et al. ................. 307/475
5,170,076 A * 12/1992 Smith ......................... 307/354

FOREIGN PATENT DOCUMENTS

JP B2-3179350 * 4/2001

* cited by examiner

*Primary Examiner*—Anh Tran
(74) *Attorney, Agent, or Firm*—Oliff & Berridge, PLC

(57) ABSTRACT

The invention simplifies the configuration of a level shifter and to allow fast operation. A level shifter includes a capacitor, to a first end of which a low-amplitude logic signal is input; first TFTs to apply an offset voltage to a second end of the capacitor; a capacitor, to a first end of which the low-amplitude logic signal is input; third TFTs to apply an offset voltage to a second end of the capacitor; and second TFTs connected in series between a supply line of a power supply voltage for a high-amplitude logic signal and a supply line of a reference voltage therefor, a node therebetween serving as an output terminal. A threshold voltage of one of the second TFTs is set to be not higher than the offset voltage applied by the first TFTs , and an offset voltage of the other of the second TFTs is set to be higher than or equal to the offset voltage applied by the third TFTs.

31 Claims, 15 Drawing Sheets

LEVEL SHIFTER AND ELECTRO-OPTICAL APPARATUS INCORPORATING THE SAME

BACKGROUND OF THE INVENTION

1. Field of Invention

The present invention relates to a level shifter that has a simple configuration and that quickly converts a low-amplitude logic signal into a high-amplitude logic signal. The present invention also relates to an electro-optical apparatus incorporating the level shifter.

2. Description of Related Art

In recent years, electro-optical apparatuses that allow display by electro-optical change in electro-optical materials, such as liquid crystal and organic EL (electroluminescence) materials, have become widely used in various information processing apparatuses and television sets as alternative display devices to cathode-ray tube (CRT) displays.

Such electro-optical apparatuses can be broadly classified, by their driving methods, into active matrix type apparatuses, in which pixels are driven by non-linear devices, such as transistors and diodes, and passive matrix type apparatuses, in which pixels are driven without using non-linear devices. It is believed that electro-optical apparatuses of the former type, i.e., active matrix type apparatuses, provide higher quality display because pixels are driven independently of each other therein.

An electro-optical apparatus of the active matrix type is constructed as follows. In an electro-optical apparatus of the active matrix type, pixel electrodes are formed respectively in association with intersections of scanning lines extending in a row direction and data lines extending in a column direction. Furthermore, non-linear devices, such as thin-film transistors, that turn on and off according to scanning signals supplied to the scanning lines, are disposed between the pixel electrodes and the data lines at the intersections, and an opposing electrode is formed so as to oppose the pixel electrodes via an electro-optical material.

A relatively high voltage is required in order to drive the electro-optical material and the non-linear devices. On the other hand, an external control circuit for supplying a clock signal, a control signal, etc., for driving to the electro-optical apparatus is usually implemented by CMOS circuits, and the amplitude of a logic signal therefor is on the order of 3 to 5 V. Thus, the electro-optical apparatus typically includes an amplitude conversion circuit (hereinafter “level shifter”) for converting a low-amplitude logic signal into a high-amplitude logic signal at an output of a driving circuit for driving the scanning lines and the data lines or at an input of a clock signal, etc.

SUMMARY OF THE INVENTION

In recent years, a strong demand has arisen for higher resolution and a larger number of steps in intensity level of display in electro-optical apparatuses. Thus, in electro-optical apparatuses, fast operation of level shifters as well as fast operation of driving circuits themselves is required. Furthermore, in addition to higher resolution, a larger number of pixels per unit length is demanded, requiring a reduction in scale of circuitry.

The present invention addresses the situation described above, and provides a level shifter that has a simple configuration with reduced scale of circuitry and that allows fast operation. The present invention also provides an electro-optical apparatus incorporating such a level shifter.

In order to address the above situation, a level shifter according to the present invention includes a first capacitor, to a first end of which a low-amplitude logic signal is input; a first offset circuit to apply a first offset voltage to a second end of the first capacitor; a second capacitor, to a first end of which the low-amplitude logic signal is input; a second offset circuit to apply a second offset voltage to a second end of the second capacitor; and first and second switching elements, connected in series between a supply line of a power supply voltage for a high-amplitude logic signal and a supply line of a reference voltage therefor. The first switching element is connected to the second end of the first capacitor, while the second switching element is connected to the second end of the second capacitor in accordance with the offset voltages.

According to the above arrangement, a DC component is removed from the low-amplitude logic signal by each of the first and second capacitors, and the first and second offset voltages are applied by the first and second offset circuits, respectively. For example, the arrangement is such that the first switching element turns on if a signal voltage at the second end of the first capacitor is not higher than a first threshold value, which is set to be lower than the first offset voltage, and the second switching element turns on if a signal voltage at the second end of the second capacitor is at or above a second threshold value, which is set to be higher than the second offset voltage, so that the first and the second switching elements, the operating points thereof having been modified, complementarily turn on and off.

In a preferred mode, as in the above example, the first switching element turns on if a signal voltage at the second end of the first capacitor is not higher than a first threshold value, which is set to be lower than the first offset voltage, and the second switching element turns on if a signal voltage at the second end of the second capacitor is at or above a second threshold value, which is set to be higher than the second offset voltage.

In the above arrangement, preferably, the first switching element is a P-channel transistor and the second switching element is an N-channel transistor, the first offset circuit is implemented by a P-channel transistor and an N-channel transistor connected in series between the supply line of the power supply voltage and the supply line of the reference voltage, a voltage at a node therebetween serving as the first offset voltage and as gate voltages of the P-channel transistor and the N-channel transistor, and the second offset circuit is implemented by a P-channel transistor and an N-channel transistor connected in series between the supply line of the power supply voltage and the supply line of the reference voltage, a voltage at a node therebetween serving as the second offset voltage and as gate voltages of the P-channel transistor and the N-channel transistor.

According to the above arrangement, even if transistor characteristics of one channel type differ from those of the other channel type, the first or the second offset voltage changes so as to offset the difference.

The above arrangement is suitable for a low-amplitude logic signal that has a frequency that is sufficiently high in relation to the capacitance of the first and the second capacitors and that changes regularly (e.g., a clock signal having a duty ratio of 50%).

However, a problem exists that when a logic signal having a low frequency is input, or when an input logic signal is maintained at the same logic level, on/off status of the first and the second switching elements becomes indeterminate.

Thus, preferably, in the above arrangement, the offset voltages of the first and the second offset circuits are changed according to the output of the level shifter, that is, according to the voltage at the node between the first and the second switching elements.

According to the above arrangement, once on/off status of the first and the second switching elements is determined, the potential at the output terminal is subsequently prevented from becoming indeterminate, due to voltage attenuation of the first or the second capacitor at the output terminal.

However, in an initial state, for example, immediately after power-up, the potential at the output terminal inevitably becomes indeterminate unless the logic level of the input logic signal transits. Accordingly, in a preferred arrangement, an initialization circuit to apply an initialization voltage to the second end of the first capacitor and to the second end of the second capacitor is provided so that the first and the second switching elements turn on and off exclusively with each other regardless of the output of the level shifter.

In particular, in the first and second offset circuit, a problem exists that generally a small current flows to cause a waste of power. For example, if the first and second offset circuits are implemented by N-channel transistors and P-channel transistors as described above, a small current flows therebetween, causing a waste of power.

Accordingly, in this arrangement, preferably, the "power supply voltages" and the "reference voltages" supplied to the offset circuits are at least partially replaced with the "low-amplitude logic signal." According to this arrangement, for example, if the offset circuits are implemented by N-channel transistors and P-channel transistors as described above, the potential difference therebetween changes in synchronization with the low-amplitude logic signal. Thus, periods of reduced potential difference, compared with the arrangement in which the power supply voltages and the reference voltages are supplied, can be achieved. The reduction in the potential difference serves to reduce power consumption.

Although the low-amplitude logic signal is used to reduce the potential difference between the N-channel transistors and the P-channel transistors constituting the offset circuits in the above arrangement, the present invention is not limited thereto, and a signal synchronized with the low-amplitude logic signal may be used.

Which of the power supplies supplied to the offset circuits is replaced with the low-amplitude logic signal or the signal synchronized with the low-amplitude logic signal is a matter of design determined in accordance with the operation mode of level shifter.

As an arrangement to avoid a waste of power, a level shifter may include a second capacitor, to a first end of which a low-amplitude logic signal is input; a second offset circuit to apply a second offset voltage to a second end of the second capacitor; and first and second switching elements, connected in series between a supply line of a power supply voltage for a high-amplitude logic signal and a supply line of a reference voltage therefor, a node therebetween serving as an output terminal. The first switching element turns on when the low-amplitude logic signal is L level, and the second switching element turns on when a signal voltage at the second end of the second capacitor is at or above a second threshold voltage, which is set to be higher than the second offset voltage.

According to the above arrangement, essentially, the first capacitor and the first offset circuit are absent in the level shifter according to the present invention described above, so that the low-amplitude logic signal is directly input to the first switching element, the first switching element turning on when the logic signal is at L level. Accordingly, since the first offset circuit itself is absent, power consumption therein need not be considered.

Since the first capacitor and the first offset circuit are absent as described above, the constituent devices are eliminated, serving to enhance manufacturing yield and to reduce cost.

As an alternative arrangement, a level shifter may include a first capacitor, to a first end of which a low-amplitude logic signal is input; an offset circuit to apply a first offset voltage to a second end of the first capacitor; and first and second switching elements, connected in series between a supply line of a power supply voltage for a high-amplitude logic signal and a supply line of a reference voltage therefor, a node therebetween serving as an output terminal. The first switching element turns on if a signal voltage at the second end of the first capacitor is at or below a first threshold voltage, which is set to be lower than the first offset voltage, and the second switching element turns on when the low-amplitude logic signal is at H level. The choice between the arrangements is a matter of design determined in accordance with the operation mode of level shifter.

By applying a level shifter according to the present invention to a driving circuit of an electro-optical apparatus, resolution and number of steps in intensity level can be considerably increased. Furthermore, scale of circuitry can be reduced.

As described hereinabove, according to the present invention, a level shifter that has a simple configuration and that allows fast operation can be implemented.

The above and other advantages of the present invention will become more apparent from the following description of embodiments.

DETAILED DESCRIPTION OF PREFERRED EMBODIMENTS

Embodiments of the present invention will be described below with reference to the drawings.

First Embodiment

Figure 1:
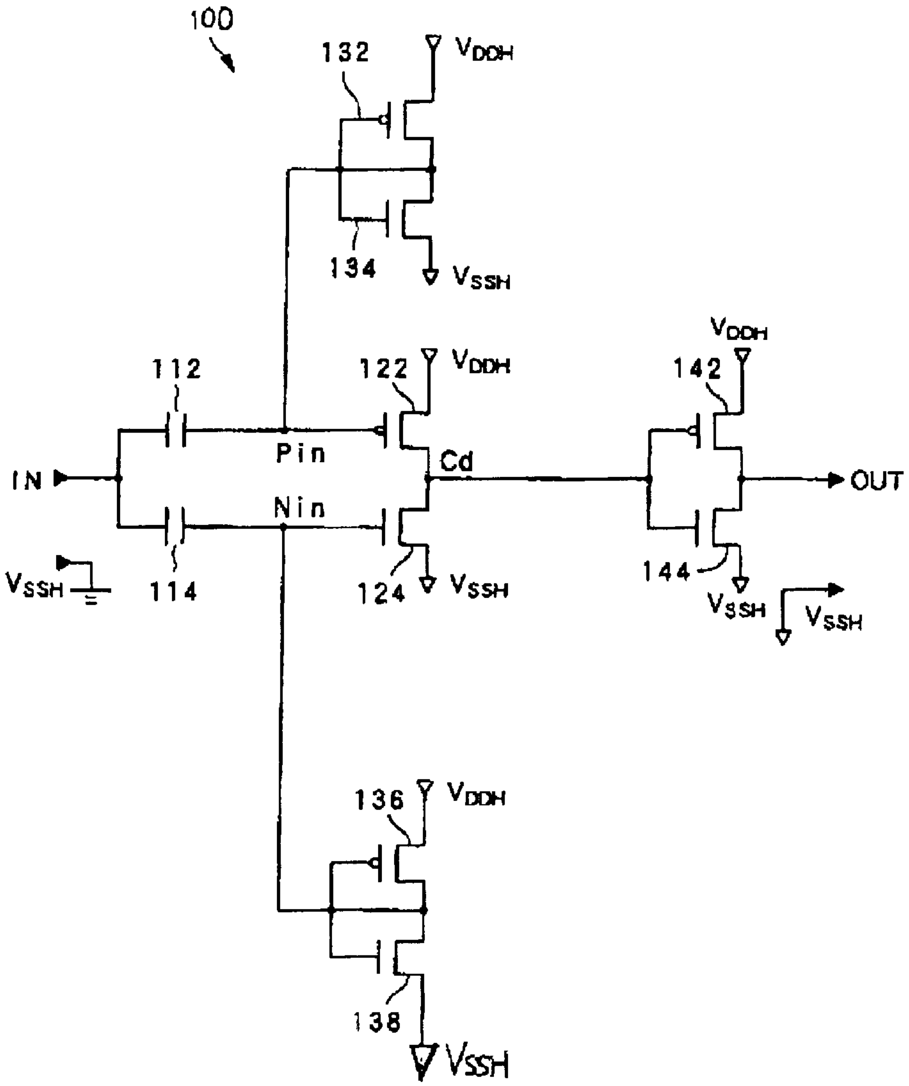
FIG. 1 is a circuit diagram showing the configuration of a level shifter according to a first embodiment of the present invention.

First, the configuration of a level shifter according to a first embodiment of the present invention will be described with reference to FIG. 1. Referring to FIG. 1, an input terminal IN receives input of a low-amplitude logic signal before conversion, and an output terminal OUT outputs a high-amplitude logic signal after conversion. For convenience of description, a lower (reference) potential corresponding to L level of the low-amplitude signal will be denoted as $V_{SSL}$, and a higher potential corresponding to H level thereof as $V_{DDL}$. Similarly, a lower (reference) potential corresponding to L level of the high-amplitude signal will be denoted as $V_{SSH}$, and a higher potential corresponding to H level thereof as $V_{DDH}$.

Referring to FIG. 1, first ends of capacitors 112 and 114 are each connected to the input terminal IN. A second end of the capacitor 112 is connected to a gate Pin of a P-channel TFT (Thin Film Transistor) 122, and a second end of the capacitor 114 is connected to a gate Nin of an N-channel TFT 124.

A source of the TFT 122, which serves as a first switching element, is connected to a supply line of the higher potential $V_{DDH}$, a source of the TFT 124, which serves as a second switching element, is connected to a supply line of the lower potential $V_{SSH}$, and drains of the TFTs 122 and 124 are commonly connected. The common drain of the TFTs 122 and 124 will be denoted as Cd.

The common drain Cd of the TFTs 122 and 124 is connected to each of gates of a P-channel TFT 142 and an N-channel TFT 144. The TFTs 142 and 144 constitute an inverter at an output stage of the level shifter 100.

More specifically, a source of the TFT 142 is connected to the supply line of the higher potential $V_{DDH}$, a source of the TFT 144 is connected to the supply line of the lower potential $V_{SSH}$, and drains of the TFTs 142 and 144 are commonly connected. The common drain of the TFTs 142 and 144 constitute the output terminal OUT of the level shifter 100.

To the second end of the capacitor 112, i.e., to the gate Pin of the TFT 122, an offset voltage $V_{ofs1}$ is applied by a P-channel TFT 132 and an N-channel TFT 134 constituting a first offset circuit. The offset voltage $V_{ofs1}$ is at the midpoint potential between the higher potential $V_{DDH}$ and the lower potential $V_{SSH}$ if the characteristics of the P-channel and N-channel TFTs 132 and 134 constituting the first offset circuit are ideally balanced. More specifically, a source of the TFT 132 is connected to the supply line of the higher potential $V_{DDH}$, a source of the TFT 134 is connected to the supply line of the lower potential $V_{SSH}$, and drains and gates of the TFTs 132 and 134 are commonly connected with each other, and the common node is connected to the second end of the capacitor 112 (the gate Pin).

Similarly, on the second end of the capacitor 114 (the gate Nin), an offset voltage $V_{ofs2}$, which is at the midpoint potential between the higher potential $V_{DDH}$ and the lower potential $V_{SSH}$, is applied by a P-channel TFT 136 and an N-channel TFT 138 constituting a second offset circuit.

For simplicity of description, it is assumed in this embodiment that the lower potential $V_{SSL}$ corresponding to L level of the low-amplitude signal and the lower potential $V_{SSH}$ corresponding to L level of the high-amplitude signal are at the same potential, and that the voltage swing of the high-amplitude signal is double that of the low-amplitude signal, i.e., $(V_{DDH}-V_{SSH})=2(V_{DDL}-V_{SSL})$. Also, for simplicity of description, on-resistance of TFTs will be disregarded. Thus, various waveforms illustrated for description somewhat differ from actual waveforms.

In this embodiment, a threshold voltage VthP, from which the P-channel TFTs base their turning on and off operations, are set to be lower than the midpoint voltage between the higher potential $V_{DDH}$ and the lower potential $V_{SSH}$. Similarly, a threshold voltage VthN, from which the N-channel TFTs base their turning on and off operations, is set to be higher than the midpoint voltage between the higher potential $V_{DDH}$ and the lower potential $V_{SSH}$.

Since the offset voltage $V_{ofs1}$ applied by the first offset circuit constituted of the TFTs 132 and 134 is $(V_{DDH}-V_{SSH})/2$, the threshold voltage VthP in this embodiment is set to be lower than the offset voltage $V_{ofs1}$. Similarly, since the offset voltage $V_{ofs2}$ applied by the second offset circuit constituted of the TFTs 136 and 138 is $(V_{DDH}-V_{SSH})/2$, the threshold voltage VthN in this embodiment is set to be higher than the offset voltage $V_{ofs2}$.

Figure 2:
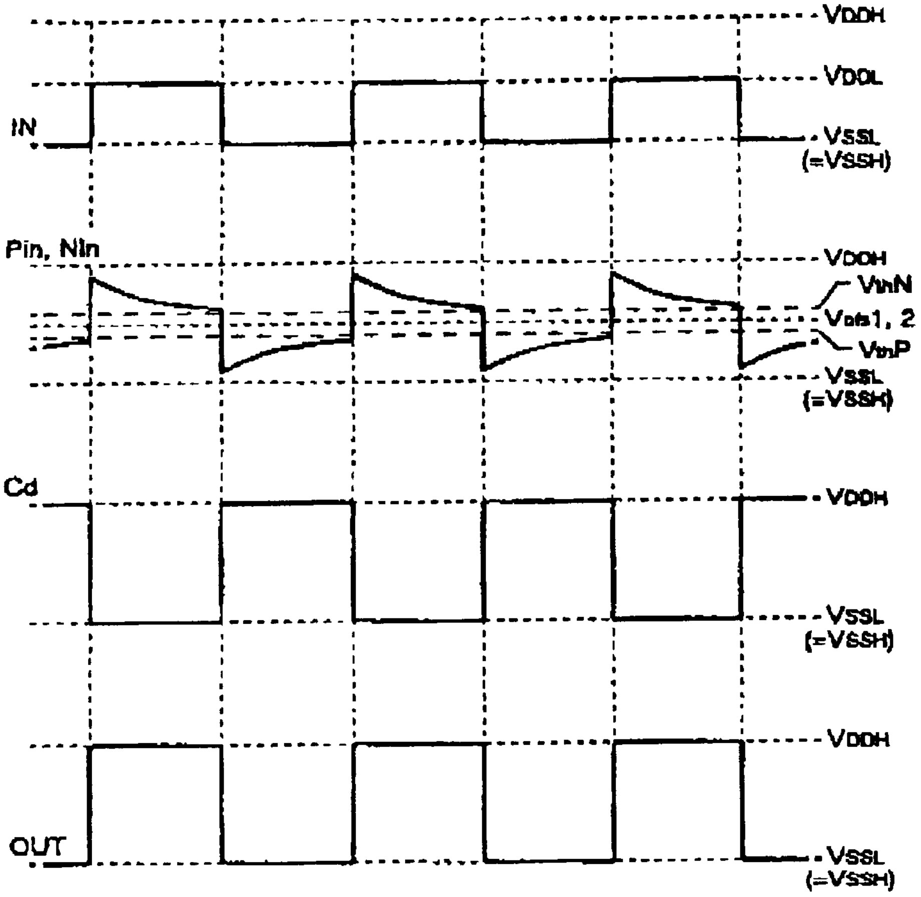
FIG. 2 is a timing chart for explaining the operation of the level shifter.

Next, the operation of the level shifter 100 configured as above will be described. FIG. 2 is a timing chart showing voltage waveforms at nodes relevant to description of the operation.

When a low-amplitude logic signal, for example, having a duty ratio of 50%, is supplied to the input terminal IN, a voltage waveform corresponding to a differential waveform of the logic signal offset by the offset voltage $V_{ofs1}$ appears at the gate Pin, whereas a voltage waveform corresponding to a differential waveform of the logic signal offset by the offset voltage $V_{ofs2}$ appears at the gate Nin. Since the offset voltages $V_{ofs1}$ and $V_{ofs2}$ are the same in this embodiment, the voltage waveforms that appear at the gates Pin and Nin are identical, as shown in FIG. 2.

When the voltage at the gate Pin exceeds the threshold voltage VthP and the voltage at the gate Nin is at or above the threshold voltage VthN, the TFT 122 turns off and the TFT 124 turns on, whereby the potential of the common drain Cd is pulled to the lower potential $V_{SSH}$. Accordingly, the potential at the output terminal OUT, i.e., the potential having been inverted by the inverter (the TFTs 142 and 144) at the output stage, is pulled to the higher potential $V_{DDH}$.

On the other hand, when the voltage at the gate Pin is at or below the threshold voltage VthP and the voltage at the gate Nin falls below the threshold voltage VthN, the TFT 122 turns on and the TFT 124 turns off, whereby the potential at the common drain Cd is pulled to the higher potential $V_{DDH}$. Accordingly, the potential at the output terminal OUT is pulled to the lower potential $V_{SSH}$.

The offset voltages $V_{ofs1}$ and $V_{ofs2}$ are at the midpoint voltage between the higher potential $V_{DDH}$ and the lower potential $V_{SSH}$ when the characteristics of the P-channel TFTs 132 and 136 and the characteristics of the N-channel TFTs 134 and 138 are ideally balanced. However, when the level shifter 100 is formed in an integrated form, it is difficult to achieve an ideal balance between the characteristics of the P-channel and N-channel TFTs, because of variations that occur in manufacturing, etc.

In view of the above, this embodiment operates so that the differences in the characteristics of the transistors will be offset, as will be described below.

For example, it can be assumed that the characteristics of the N-channel TFTs including the TFTs 134 and 138 are inferior to the characteristic of the P-channel TFTs including the TFTs 132 and 136.

Figure 3:
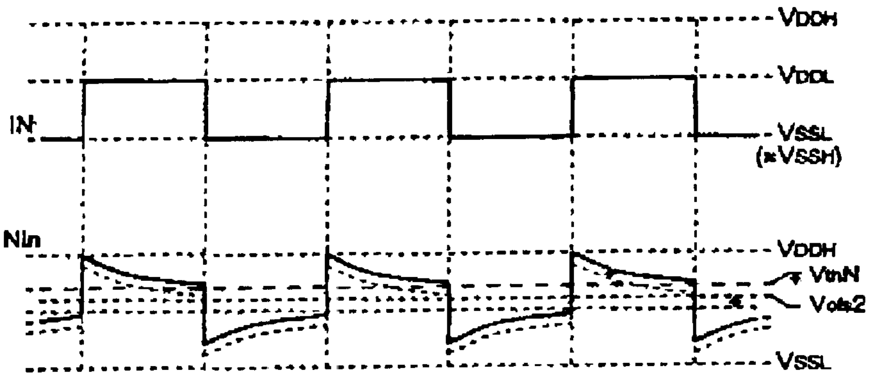
FIG. 3 is a timing chart for explaining the operation of the level shifter.

The characteristics of the N-channel TFTs being inferior indicates that the N-channel TFTs are less likely to turn on. That is, as shown in FIG. 3, the threshold voltage thereof becomes higher compared with a case where the characteristics of the P-channel and N-channel TFTs are equivalent.

If the characteristics of the N-channel TFT 138 are inferior to the characteristics of the P-channel TFT 136, the resistance of the former is higher than that of the latter. Thus, as shown in FIG. 3, the offset voltage $V_{ofs2}$ at the node therebetween becomes higher compared with a case where the characteristics of the TFTs 136 and 138 are equivalent.

Thus, the N-channel TFT 124 becomes less likely to turn on due to the threshold voltage VthN being higher, but at the same time the offset voltage $V_{ofs2}$ becomes higher. That is, the offset voltage $V_{ofs2}$ rises so as to offset reduction in the likelihood of the N-channel TFT 124 turning on.

A similar situation occurs in a case where, conversely, the characteristics of the P-channel TFTs are inferior to the characteristics of the N-channel TFTs, although not shown.

Thus, according to this embodiment, even if characteristics of TFTs of one channel type are inferior to those of TFTs of the other channel type, the offset voltage $V_{ofs1}$ or $V_{ofs2}$ changes so as to offset difference in the characteristics, so that this embodiment is unsusceptible to the effect of the difference in the TFT characteristics.

Second Embodiment

In the first embodiment described above, the logic signal supplied to the input terminal IN has a frequency sufficiently high in relation to a time constant determined by the capacitance of the capacitors 112 and 114 and associated circuit elements, and has a duty ratio of approximately 50%. The signal is typically like a clock signal.

In the level shifter 100 according to the first embodiment, however, the signal voltage of the differential waveform associated with the capacitor 112 (114) ultimately converges to the offset voltage $V_{ofs1}$ ($V_{ofs2}$). Thus, if the frequency of an input logic signal is low, or if an input logic signal remains at the same logic level for a long period as in the case of an irregular pulse signal, the signal voltage of the differential waveform changes across the threshold voltage VthP (VthN).

Figure 4:
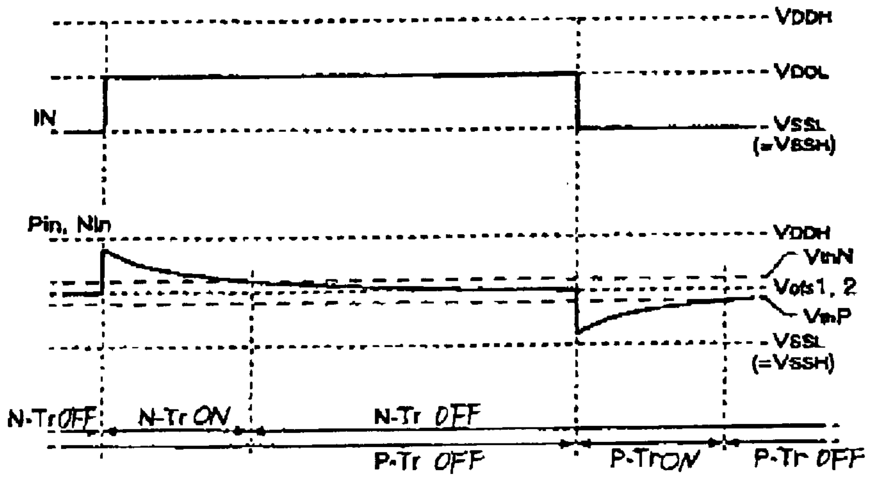
FIG. 4 is a timing chart for explaining a problem that occurs in the level shifter.

For example, as shown in FIG. 4, if the logic signal supplied to the input terminal IN transits to the higher potential $V_{DDL}$ corresponding to H level and is maintained for a relatively long period, the potential at the gate Nin falls below the threshold voltage VthN. Thus, even though the logic signal supplied to the input terminal IN is at the higher potential $V_{DDL}$ corresponding to H level, the N-channel TFT 122 as well as the P-channel TFT 124 turns off, leaving the potential at the common drain Cd in an unintended state.

Similarly, when the logic signal input to the input terminal IN transits to the lower potential $V_{SSL}$ corresponding to L level and is maintained for a relatively long period, the potential at the gate Pin exceeds the threshold voltage VthP. Thus, even though the logic signal supplied to the input terminal IN is at the lower potential $V_{SSL}$ corresponding to L level, the P-channel TFT 124 as well as the N-channel TFT 122 turns off, leaving the potential at the common drain Cd in an unintended state.

When the potential at the common drain Cd is left uncontrolled as described above, the potential at the output terminal OUT in the inverter at the output stage is also left in an unintended state. Thus, although the level shifter 100 according to the first embodiment allows fast operation, restriction is imposed on the input logic signal.

Figure 5:
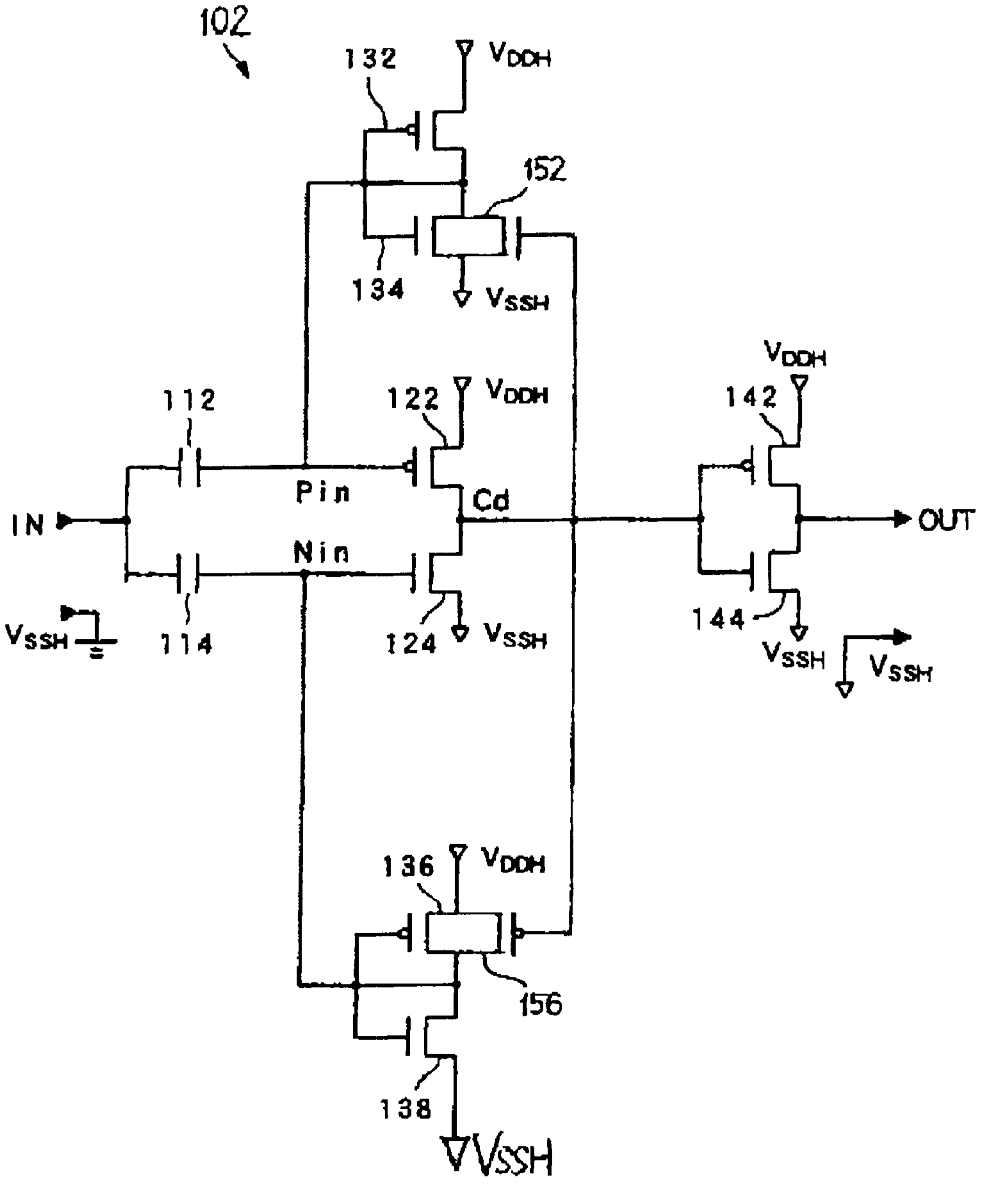
FIG. 5 is a circuit diagram showing the configuration of a level shifter according to a second embodiment of the present invention.

Now, a second embodiment, which is free of the above restriction, will be described. FIG. 5 is a circuit diagram showing the configuration of a level shifter 102 according to the second embodiment. Referring to FIG. 5, difference from the first embodiment (see FIG. 1) lies in the fact that an N-channel TFT 152 and a P-channel TFT 156 are additionally provided.

More specifically, with regard to the TFT 152, a gate thereof is connected to the common drain Cd of the TFTs 122 and 124, a source thereof is connected to the supply line of the lower potential $V_{SSH}$, and a drain thereof is connected to the drains (gates) of the TFTs 132 and 134. That is, the TFT 152 turns on if the potential at the common drain Cd is at H level of the high-amplitude signal, forcibly pulling the potential at the gate Pin of the TFT 122 to the lower potential $V_{SSH}$.

Similarly, with regard to the TFT 156, a gate thereof is connected to the common drain Cd of the TFTs 122 and 124, a source thereof is connected to the supply line of the higher potential $V_{DDH}$, and a drain thereof is connected to the drains (gates) of the TFTs 136 and 138. That is, the TFT 152 turns on if the potential at the common drain Cd is at L level of the high-amplitude signal, forcibly pulling the potential at the gate Nin of the TFT 124 to the higher potential $V_{DDH}$.

The configuration is otherwise the same as in the first embodiment, and thus will not be described further.

Figure 6:
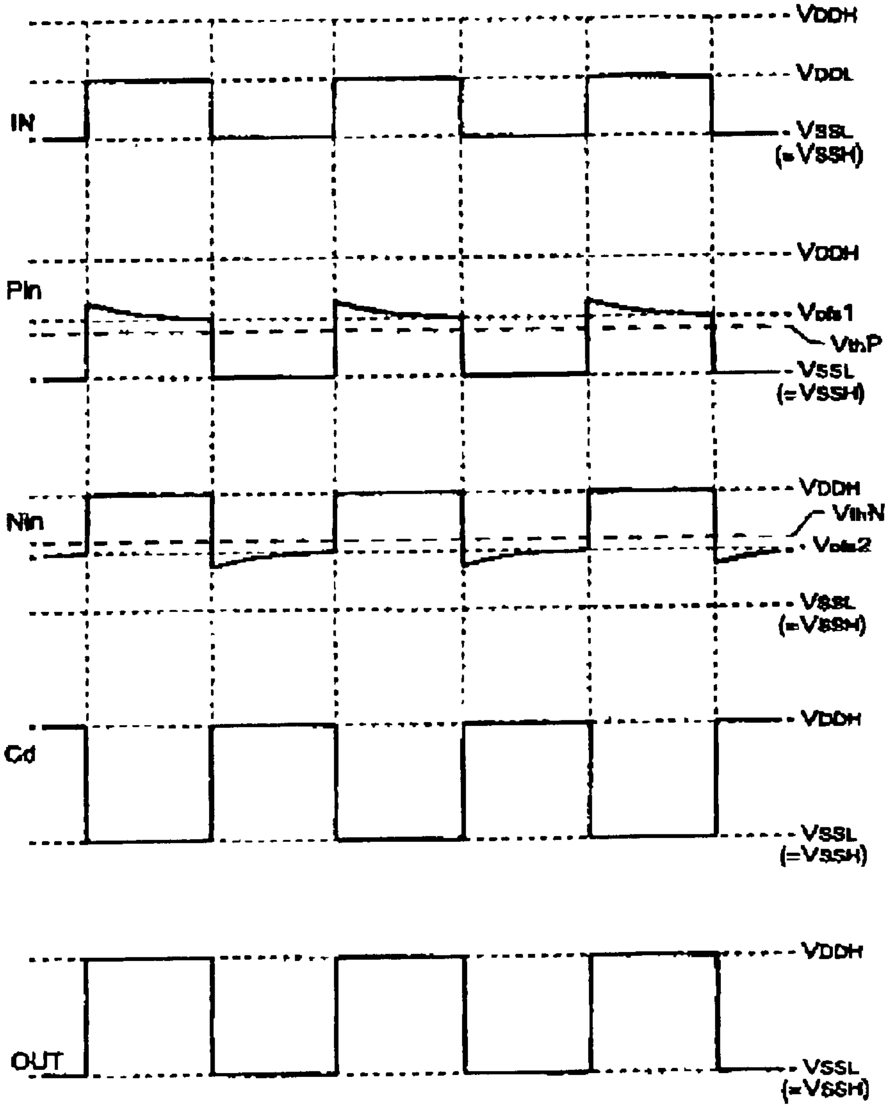
FIG. 6 is a timing chart for explaining the operation of the level shifter.

Next, the operation of the level shifter 100 configured as above will be described. FIG. 6 is a timing chart showing voltage waveforms at nodes relevant to description of the operation. As described above, for simplicity of description, on-resistance of TFTs will be disregarded. Thus, various waveforms illustrated for description somewhat differ from actual waveforms. However, this will not be any problem in understanding the gist of the operation.

When the low-amplitude logic signal supplied to the input terminal IN transits from the lower potential $V_{SSL}$ to the higher potential $V_{DDL}$, the potential at the gate Pin exceeds the threshold voltage VthP at a rise of the differential waveform thereof, turning off the P-channel TFT 122, while the potential at the gate Nin is at or above the threshold voltage VthN, turning on the N-channel TFT 124. Accordingly, the potential at the common drain Cd is pulled to the lower potential $V_{SSH}$ corresponding to L level. Thus, the TFT 156 turns on, and as a result, the potential at the gate Nin is maintained at the higher potential $V_{DDH}$ regardless of the offset voltage applied by the TFTs 136 and 138. Accordingly, even if the low-amplitude logic signal is subsequently maintained at the higher potential $V_{DDL}$ for a long period, the potential at the gate Nin does not fall below the threshold voltage VthN.

On the other hand, since the TFT 152 turns off, the potential at the gate Pin corresponds to the differential waveform of the input logic signal offset by the offset voltage $V_{ofs1}$, similarly to the first embodiment.

Conversely, when the low-amplitude logic signal supplied to the input terminal IN transits from the higher potential $V_{DDL}$ to the lower potential $V_{SSL}$, the potential at the gate Pin is at or below the threshold voltage VthP at a fall of the differential waveform of the logic signal, turning on the TFT 122, while the potential at the gate Nin falls below the threshold voltage VthN, turning off the TFT 124. Accordingly, the potential at the common drain Cd is pulled to the higher potential $V_{DDH}$ corresponding to H level. Thus, the TFT 152 turns on, and as a result, the potential at the gate Nin is maintained at the lower potential $V_{SSH}$ regardless of the offset voltage applied by the TFTs 132 and 134. Accordingly, even if the low-amplitude logic signal is subsequently maintained at the lower potential $V_{SSL}$ for a long period, the potential at the gate Pin does not exceed the threshold voltage VthP.

On the other hand, since the TFT 156 turns off, the potential at the gate Nin corresponds to the differential waveform of the input logic signal offset by the offset voltage $V_{ofs2}$, similarly to the first embodiment.

Thus, in the level shifter 102 according to the second embodiment, even if the input logic signal is maintained at the same logic level for a long period, the TFTs 122 and 124 do not turn off simultaneously. Thus, according to the second embodiment, restriction is not imposed on the input logic signal as opposed to the first embodiment.

Actually, however, the offset voltage is determined by the resistance ratio of the three transistors constituting the first or the second offset circuit. Thus, more complex waveforms will be output than those shown in FIG. 6 for simplified description of the operation.

Third Embodiment

In the second embodiment, the potential at the gate Pin or Nin is forcibly pulled to the lower potential $V_{SSH}$ or the higher potential $V_{DDH}$ depending on the potential at the common drain Cd. That is, the gate potential on the input side is determined according to the drain potential on the output side. Thus, a problem exists that the output is indeterminate in an initial state, for example, immediately after power-up.

Now, a third embodiment, which is free of the above problem, will be described. In the third embodiment, a first mode in which the potentials at the gates Pin and Nin are reset to a potential corresponding to L level, and a second mode in which the potentials are reset to a potential corresponding to H level can be assumed, and description will first be directed to the first mode.

Figure 7:
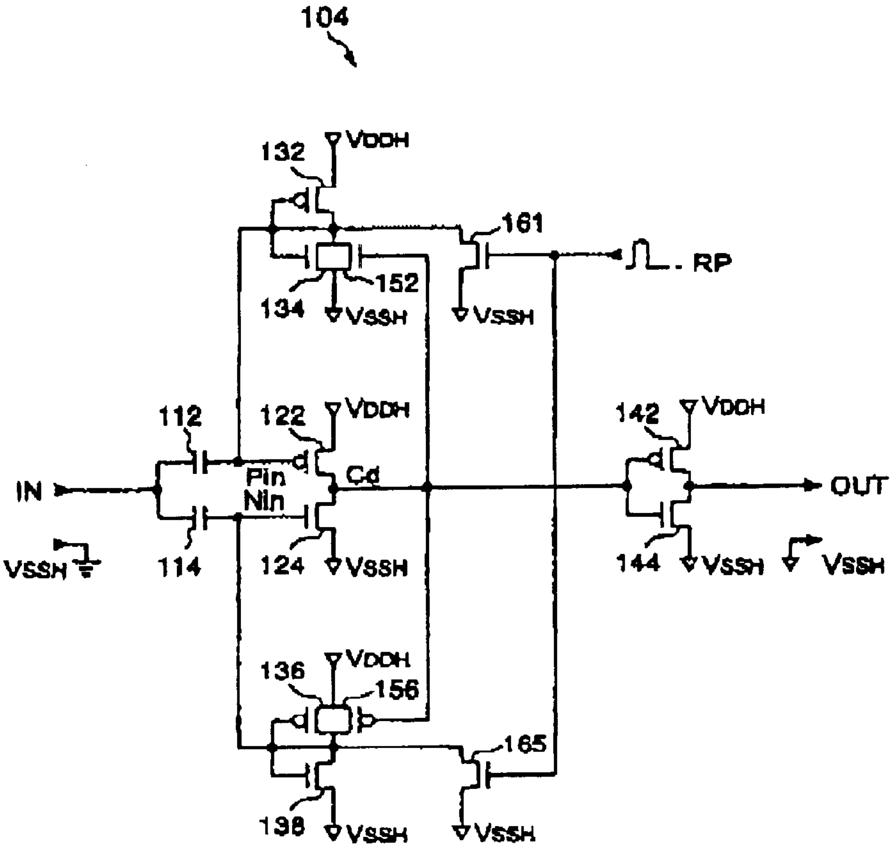
FIG. 7 is a circuit diagram showing the configuration of a level shifter according to a first mode of a third embodiment of the present invention.

FIG. 7 is a circuit diagram showing the configuration of a level shifter 104 according to the first mode of the third embodiment. Referring to FIG. 7, the difference from the second embodiment (see FIG. 5) lies in the fact that N-channel TFTs 161 and 165 are additionally provided.

More specifically, with regard to the TFT 161, a source thereof is connected to the supply line of the lower potential $V_{SSH}$, and a drain thereof is connected to the drains (gates) of the TFTs 132 and 134. With regard to the TFT 165, a source thereof is connected to the supply line of the lower potential $V_{SSH}$, and a drain thereof is connected to the drains (gates) of the TFTs 136 and 138. A reset pulse Rp, which is pulled to the higher potential $V_{DDH}$ at the time of resetting, is supplied to the gates of the TFTs 161 and 165.

The configuration is otherwise the same as the second embodiment, and will not be described further.

Figure 8:
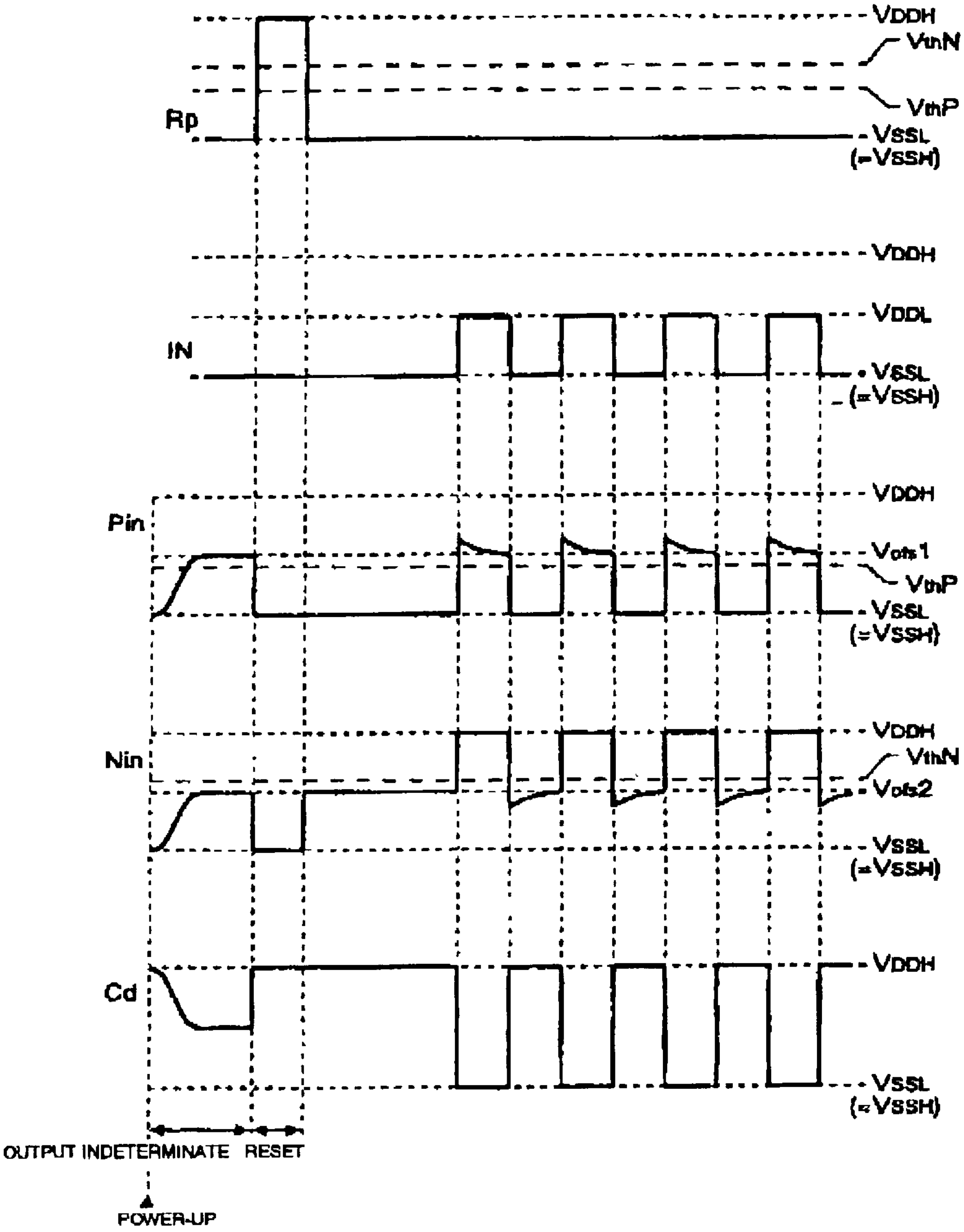
FIG. 8 is a timing chart for explaining the operation of the level shifter.

FIG. 8 is a timing chart showing voltage waveforms at nodes relevant to description of the operation of the level shifter 104.

When the potential of the logic signal supplied to the input terminal IN remains the same immediately after power-up, the potential at the gate Pin is at the offset voltage $V_{ofs1}$, and the potential at the gate Nin is at the offset voltage $V_{ofs2}$. In this state, the TFTs 122 and 124 both turn off, leaving the potential at the drain Cd, and therefore the potential at the output terminal OUT, indeterminate.

When the reset pulse Rp is supplied with the potential thereof at the higher potential $V_{DDH}$, the TFTs 161 and 165 turn on, whereby the potentials at the gates Pin and Nin are forcibly reset to the lower potential $V_{SSH}$. Accordingly, the TFT 122 turns on and the TFT 124 turns off, whereby the drain Cd is pulled to and becomes determinate at the higher potential $V_{DDH}$. The subsequent operation is the same as in the second embodiment.

Figure 9:
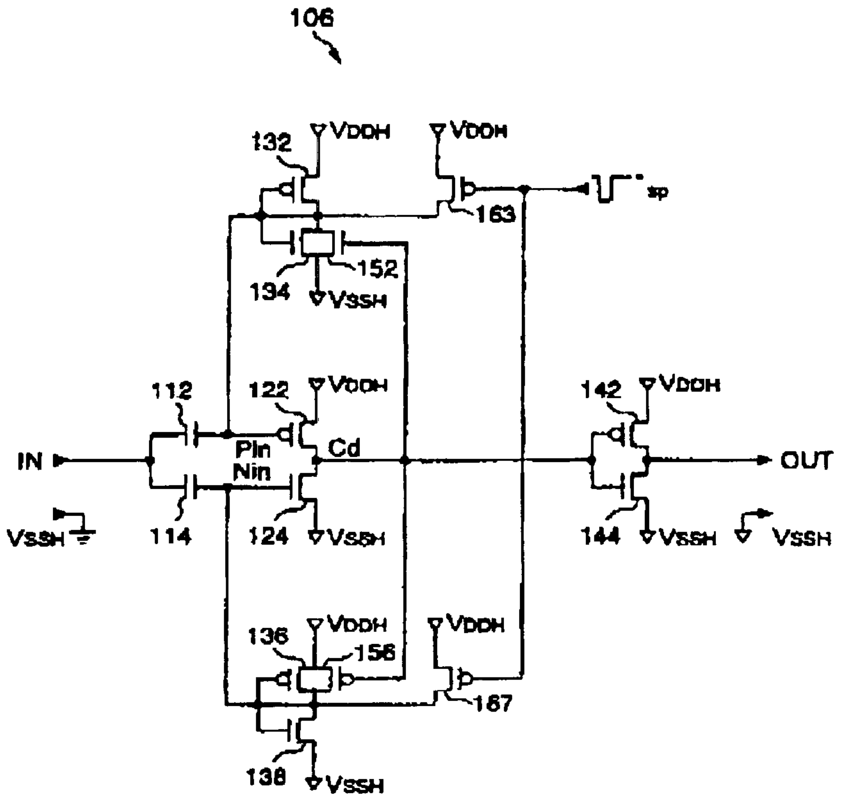
FIG. 9 is a circuit diagram showing the configuration of a level shifter according to a second mode of the third embodiment of the present invention.

FIG. 9 is a circuit diagram showing the configuration of a level shifter 106 according to the second mode of the third embodiment. Referring to FIG. 9, the difference from the second embodiment (see FIG. 5) lies in the fact that P-channel TFTs 163 and 167 are additionally provided.

More specifically, with regard to the TFT 163, a source thereof is connected to the supply line of the higher potential $V_{DDH}$, and a drain thereof is connected to the drains (gates) of the TFTs 132 and 134. With regard to the TFT 167, a source thereof is connected to the supply line of the higher potential $V_{DDH}$, and a drain thereof is connected to the drains (gates) of the TFTs 136 and 138. A set pulse Sp, which is pulled to the lower potential $V_{SSH}$ at the time of setting, is supplied to the gates of the TFTs 163 and 167.

The configuration is otherwise the same as in the second embodiment, and will not be described further.

Figure 10:
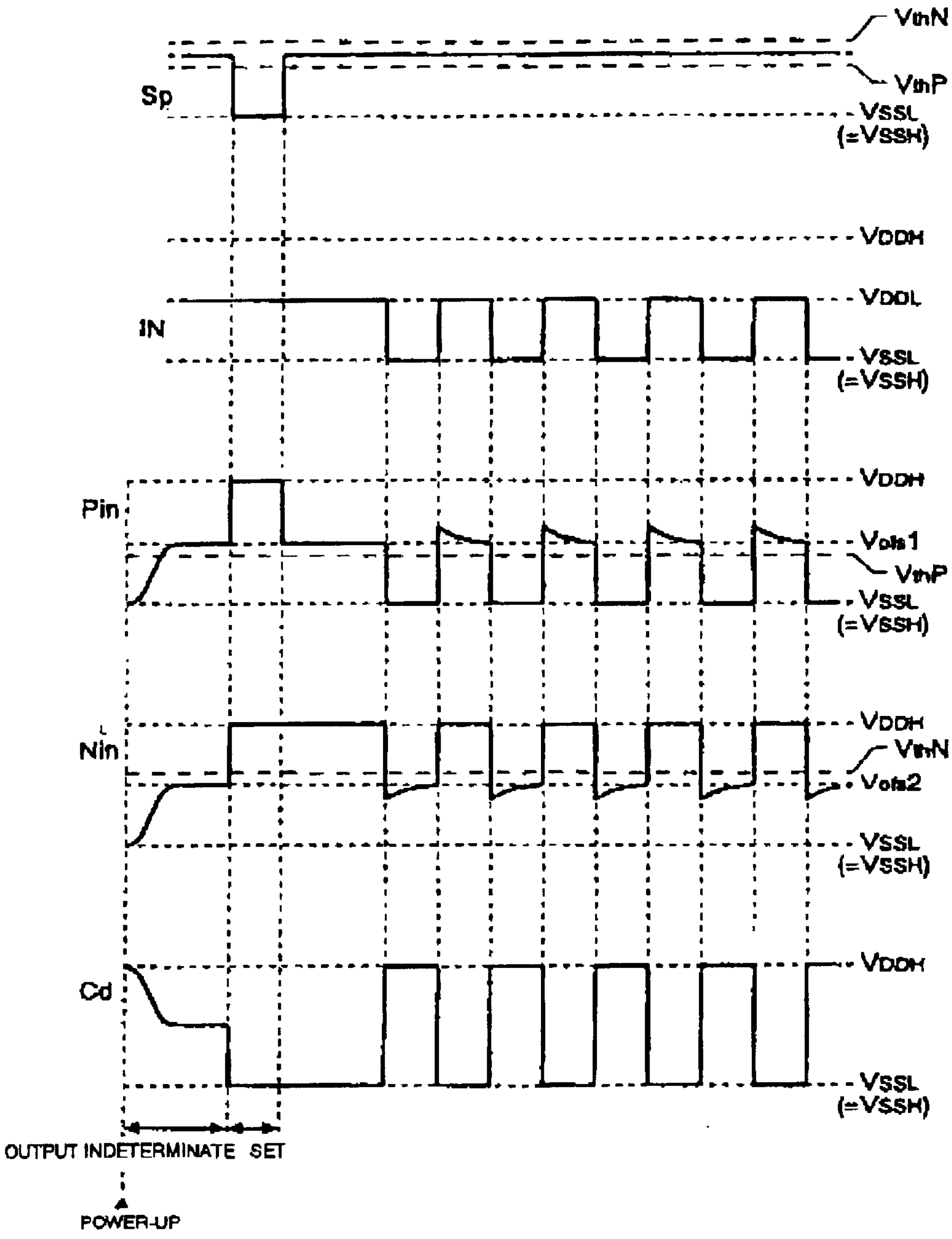
FIG. 10 is a timing chart for explaining the operation of the level shifter.

FIG. 10 is a timing chart showing voltage waveforms at nodes relevant to description of the operation of the level shifter 106.

If the potential of the logic signal supplied to the input terminal IN remains the same immediately after power-up, for the same reason as in the first mode, the TFTs 122 and 124 both turn off, leaving the potential at the drain Cd, and therefore the potential at the output terminal OUT, indeterminate.

When the set pulse Sp is supplied with the potential thereof at the lower potential $V_{SSH}$, the TFTs 163 and 167 turn on, whereby the potentials at the gates Pin and Nin are forcibly set to the higher potential $V_{DDH}$. Accordingly, the TFT 122 turns off and the TFT 124 turns on, whereby the drain Cd is pulled to and becomes determinate at the lower potential $V_{SSH}$. The subsequent operation is the same as in the second embodiment.

Actually, however, the offset voltage is determined by the resistance ratio of the three transistors constituting the first or the second offset circuit and the transistors provided for initialization. Thus, more complex waveforms will be output than those shown in FIG. 10 for simplified description of the operation.

Fourth Embodiment

As described above, according to the present invention, a level shifter that has a simple configuration and that allows fast operation can be implemented. However, the level shifters 100, 102, 104, and 106 according to the first to the third embodiment described above commonly suffer from the following problem. That is, electric power is wasted in the first offset circuit constituted of the TFTs 132 and 134 and in the second offset circuit constituted of the TFTs 136 and 138. This is because a voltage difference between the higher potential $V_{DDH}$ and the lower potential $V_{SSH}$ is constantly applied between the TFTs 132 and 134, or between the TFTs 136 and 138 in the first or the second offset circuit, whereby a small current flows from the TFT 132 to the TFT 134 or from the TFT 136 to the TFT 138.

Figure 11:
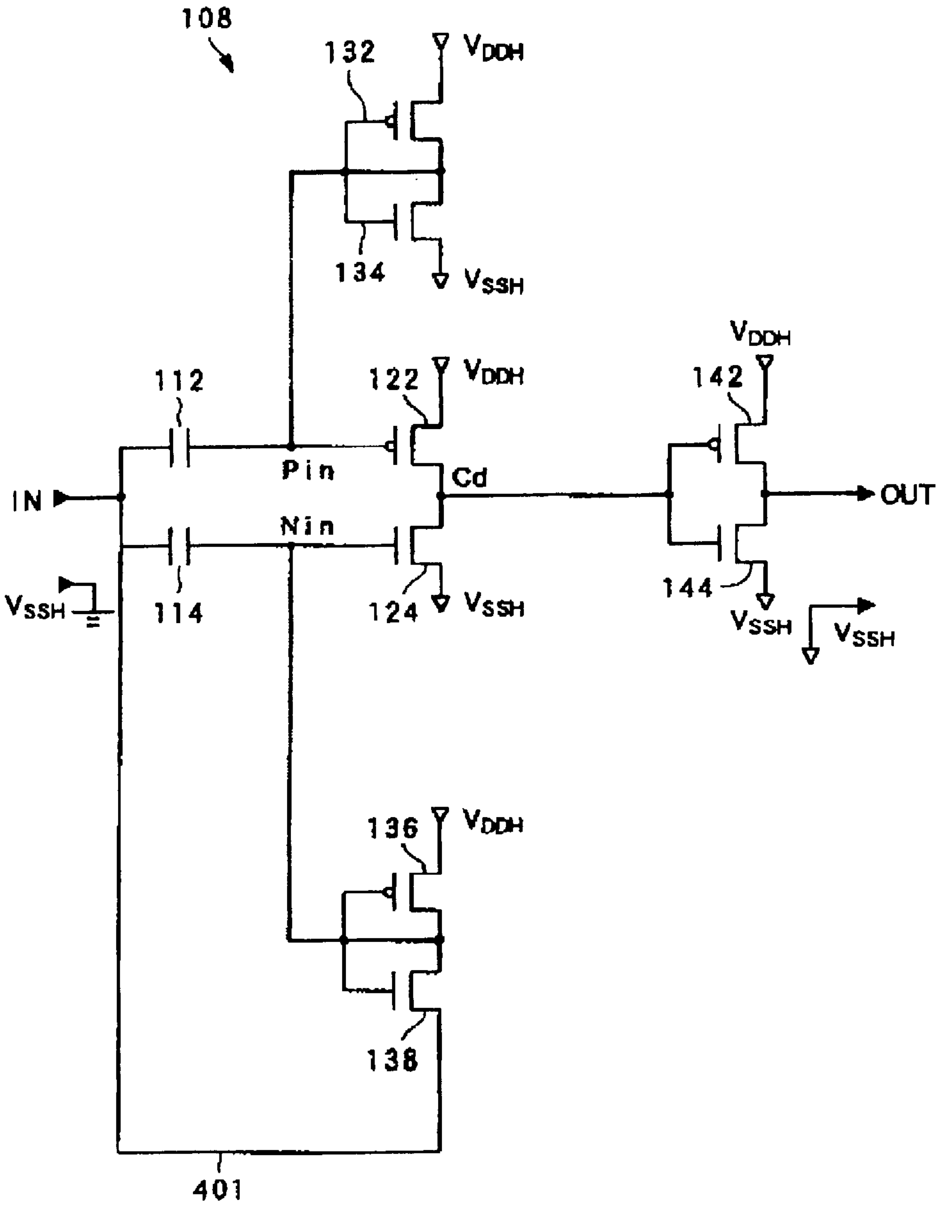
FIG. 11 is a circuit diagram showing the configuration of a level shifter according to a fourth embodiment of the present invention.

Now, a fourth embodiment of the present invention, which is free of the above problem, will be described with reference to FIG. 11. FIG. 11 is a circuit diagram showing the configuration of a level shifter 108 according to the fourth embodiment. The level shifter 108 shown in FIG. 11 is based on the first embodiment, and the fourth embodiment can be considered as a modification of the first embodiment.

Referring to FIG. 11, a short-circuiting line 401 to short-circuit the source of the TFT 138 constituting the second offset circuit with the input terminal IN is provided. Accordingly, the voltage applied between the TFTs 136 and 138 of the second offset circuit is reduced. More specifically, for example, assuming that $V_{DDH}$=6 [V], $V_{DDL}$=3 [V], and $V_{SSH}$=$V_{SSL}$=0 [V], as opposed to the first embodiment in which a potential difference of $V_{DDH}$–$V_{SSH}$=6 [V] is constantly applied while in operation, in the fourth embodiment, the voltage takes on one of two values $V_{DDH}$–$V_{DDL}$=6 [V] and $V_{DDH}$–$V_{SSL}$=3 [V] in synchronization with the input signal. Because periods of reduced potential difference exist, current that flows between the TFTs 136 and 138 is reduced.

Furthermore, the rise in the offset potential enhances driving ability of the N-channel TFT 124. Thus, the TFT 124 can be reduced in size in the fourth embodiment compared with the first embodiment described earlier. The configuration is otherwise the same as in the first embodiment, and will not be described further.

Although the arrangement described above is such that the source of the TFT 138 constituting the second offset circuit is short-circuited with the input terminal IN, the present invention is not limited thereto. The same advantages can be achieved by an arrangement in which voltages supplied to the offset circuits are partially supplied from an input signal line. The determination as to which of the voltages is replaced with the input signal is a matter of design.

Furthermore, although the arrangement described above is provided such that an input signal is directly input to the TFT 138 in the second offset circuit, the present invention is not limited thereto. That is, the advantages of this embodiment may be implemented by other than short-circuiting the TFT 138 or the TFT 134 with the input terminal IN. More broadly, the voltages supplied to the offset circuits can be partially replaced by a separate power supply to generate a signal synchronized with the input signal.

Fifth Embodiment

Figure 12:
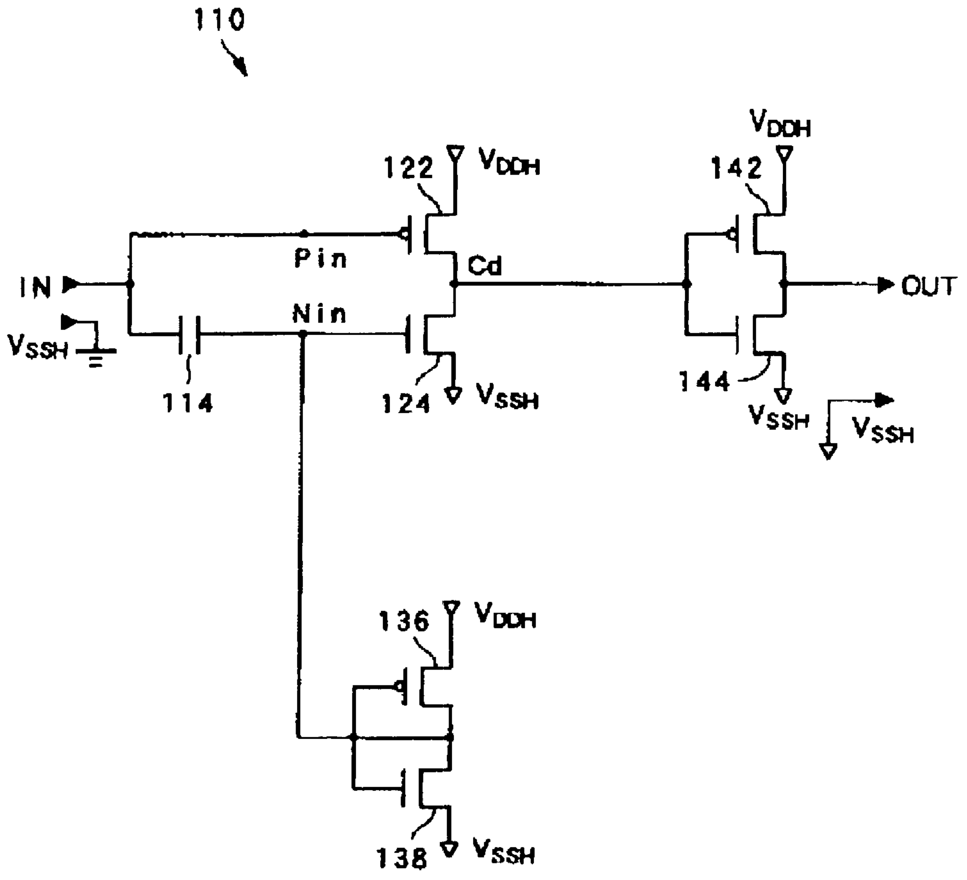
FIG. 12 is a circuit diagram showing the configuration of a level shifter according to a fifth embodiment of the present invention.

As described above, according to the fourth embodiment, a waste of power can be avoided by inputting an input signal to the first or the second offset circuit. Hereinafter, an arrangement that achieves substantially the same advantages more efficiently will be described as a fifth embodiment of the present invention. FIG. 12 is a circuit diagram showing the configuration of a level shifter 110 according to the fifth embodiment. The level shifter 110 shown in FIG. 10 is based on the first embodiment described above, and the fifth embodiment can be considered as a modification of the first embodiment.

In FIG. 12, the capacitor 112 and the first offset circuit, provided in the embodiments described above, are absent. The configuration is otherwise the same as the first embodiment, and will not be described further.

Figure 13:
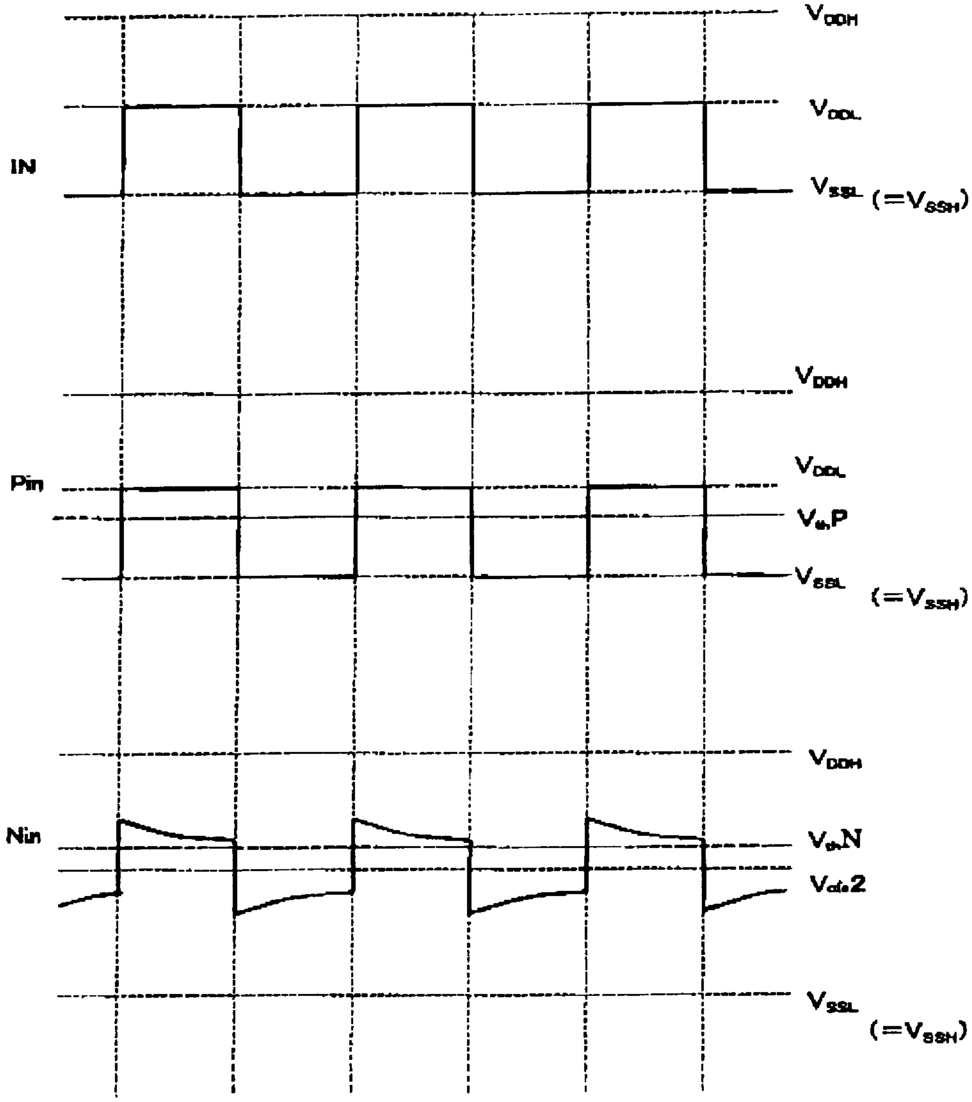
FIG. 13 is a timing chart for explaining the operation of the level shifter.

Next, the operation of the level shifter 110 configured as above will be described. FIG. 13 is a timing chart showing voltage waveforms at nodes relevant to description of the operation. Since the fifth embodiment is based on the first embodiment as mentioned above, the operation is substantially the same as that described with reference to FIG. 2. Thus, illustration and description of common features will be omitted or simplified, and description will be directed to characterizing features of the fifth embodiment.

In the fifth embodiment, when a low-amplitude logic signal having a duty ratio of 50% is supplied to the input terminal IN, a voltage waveform directly reflecting the waveform of the logic signal appears at the gate Pin. This is because the capacitor 112 and the first offset circuit are not present. A voltage waveform that appears at the gate Nin is the same as in the first embodiment.

In this case, when the voltage at the gate Pin exceeds the threshold voltage VthP, i.e., when the value of the input signal is $V_{DDL}$, and also the voltage at the gate Nin is at or above the threshold voltage VthN, the TFT 122 turns off and the TFT 124 turns on. On the other hand, when the voltage at the gate Pin is at or below the threshold voltage VthP, i.e., when the value of the input signal is $V_{SSL}$, and also the voltage at the gate Nin falls below the threshold voltage VthN, the TFT 122 turns on and the TFT 124 turns off. The potentials at the subsequent inverter (TFTs 142 and 144) and at the output terminal OUT are substantially the same as those described with reference to FIG. 2.

In the fifth embodiment, since the first offset circuit is absent as described above, power consumed therein does not need to be considered. That is, in the fifth embodiment, compared with the first embodiment described above, power consumption is reduced due to the absence of the first offset circuit.

Figure 14:
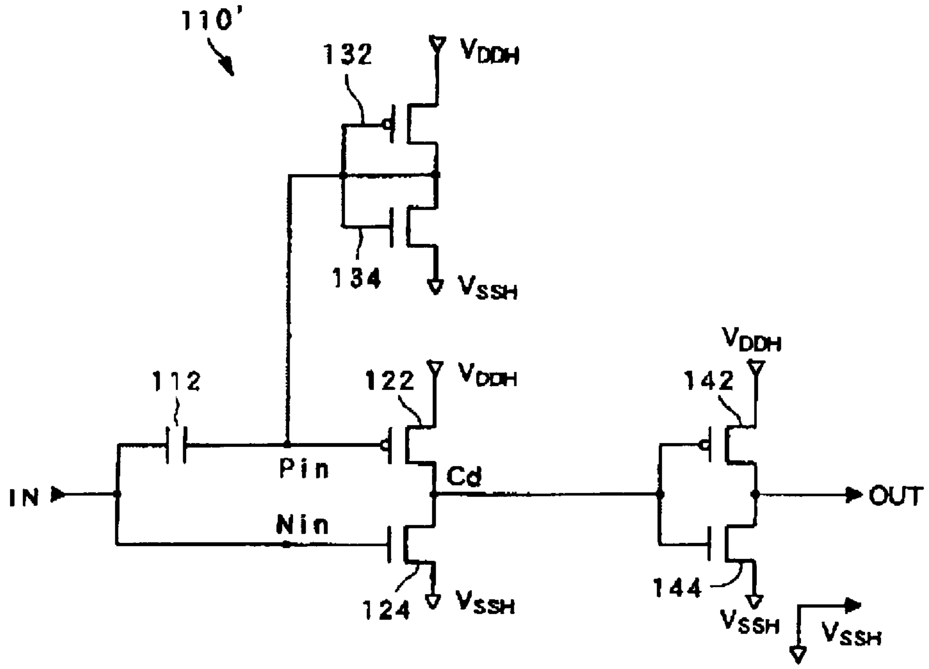
FIG. 14 is a circuit diagram showing the configuration of a level shifter according to the fifth embodiment, in a mode different from that shown in FIG. 12.

Although the first offset circuit is absent in the arrangement described above, the present invention is not limited thereto. For example, conversely, a level shifter 110', in which the second offset circuit is absent, as shown in FIG. 14, may be implemented. According to the arrangement, since the second offset circuit is not present, power consumed therein does not need to be considered. Accordingly, power consumption is reduced, achieving substantially the same advantage as described above.

Supplementary Description of Embodiments

Although the fourth and fifth embodiments employ configurations based on the level shifter 100 according to the first embodiment, the present invention is not limited thereto. That is, short-circuiting of the source of the TFT 134 or 138 constituting the first or the second offset circuit with the input terminal IN (the fourth embodiment) and the absence of the first or the second offset circuit (the fifth embodiment), etc. may be applied to FIG. 5 (the second embodiment), FIG. 7 (the first mode of the third embodiment), and FIG. 9 (the second mode of the third embodiment).

Figure 15:
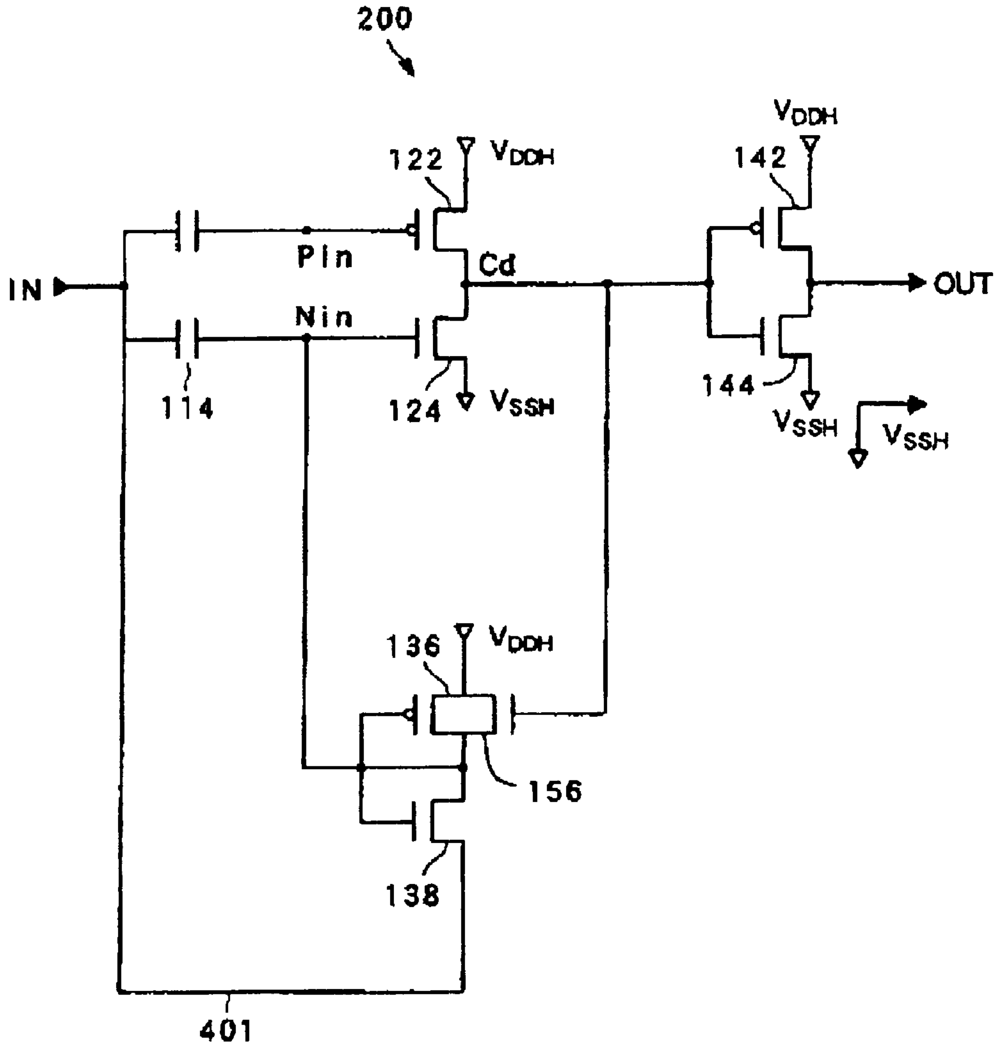
FIG. 15 is a circuit diagram showing the configuration of a level shifter in which features of the second, fourth, and fifth embodiments of the present invention are simultaneously applied.

Furthermore, it is to be understood that an arrangement having a combination of the features of the fourth and fifth embodiments is within the scope of the present invention. FIG. 15 shows, as an example thereof, a level shifter 200, in which the source of the TFT 138 in the second offset circuit is short-circuited with the input terminal IN via the short-circuiting line 401 as in the fourth embodiment and in which the capacitor 112 and the first offset circuit are absent as in the fifth embodiment. The arrangement shown in FIG. 15 is based on the second embodiment shown in FIG. 5, and a capacitor 156 is provided for the purpose of feedback from the common drain Cd. Thus, as described in relation to the second embodiment, even if the input signal exhibits DC variation, substantially the same advantage, i.e., stable operation, is achieved.

According to the above arrangement, a potential difference applied between the TFTs 136 and 138 in the second offset circuit is reduced compared with before, so that a waste of power is avoided. In addition, because the first offset circuit is not present, no such thing as power consumption in the first offset circuit exists.

In sum, according to the arrangement shown in FIG. 15, advantages of both the fourth and the fifth embodiments are simultaneously achieved. The inventors of the present invention verified that it is possible to reduce power consumption to on the order of 1/6 to 1/7 according to the example of most preferred embodiment shown in FIG. 15 compared with the first embodiment shown in FIG. 1.

It is to be understood that various modifications (e.g., an arrangement having a combination of the features of the third embodiment and the fourth or the fifth embodiment) are possible, illustration and description of which are omitted herein.

Furthermore, although TFTs are used as an example of switching elements in the embodiments described above, the present invention is not limited thereto. That is, various types of switching elements, including bipolar type, MOS (Metal Oxide Semiconductor) type, or more broadly, MIS (Metal Insulator Semiconductor) type, may be used.

Embodiment of Electro-Optical Apparatus

Figure 16:
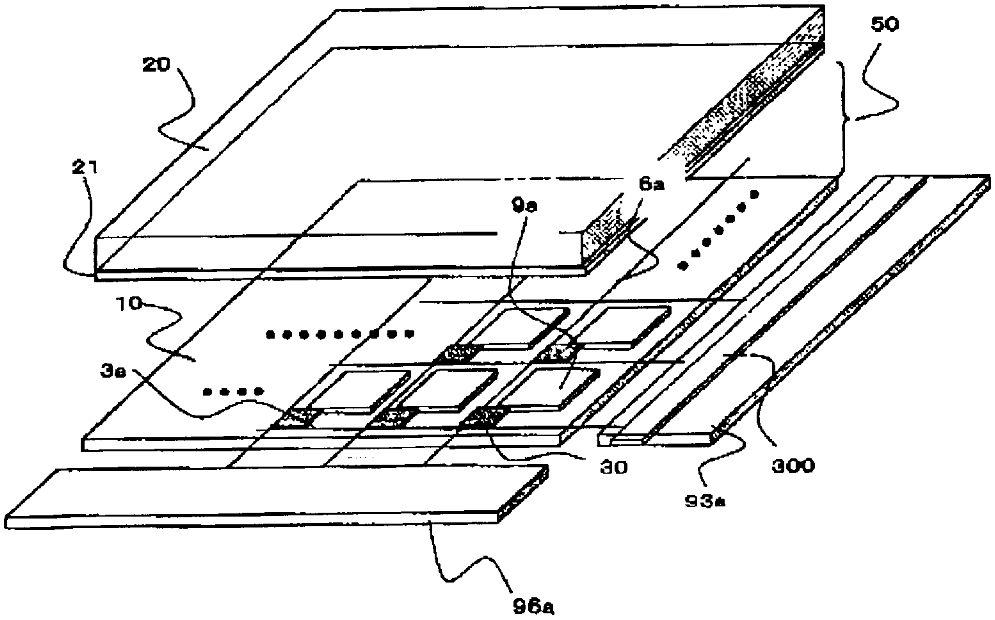
FIG. 16 is a schematic perspective view of an electro-optical apparatus according to an embodiment of the present invention.

The level shifters described above may be used, for example, in a driving circuit of an electro-optical apparatus, such as a liquid crystal apparatus. The electro-optical apparatus will be described below with reference to FIG. 16. FIG. 16 is a schematic perspective view showing the electro-optical apparatus according to this embodiment.

In FIG. 16, the electro-optical apparatus includes a TFT array substrate 10 on which pixel electrodes 9*a* arranged in a matrix form, TFTs 30 connected to the pixel electrodes 9*a*, and scanning lines 3*a* and data lines 6*a* connected to the TFTs 30 are formed. The pixel electrodes 9*a* are formed of transparent conductive material, such as ITO (Indium Tin Oxide). The scanning lines 3*a* and the data lines 6*a* are formed in a grating form so as to extend through the gaps between the pixel electrodes 9*a* arranged in a matrix form, as shown in FIG. 16. The scanning lines 3*a* are connected to a scanning line driving circuit 93*a*, and the data lines 6*a* are connected to a data line driving circuit 96*a*. The scanning line driving circuit 93*a* supplies scanning signals to the scanning lines 3*a*, for example, line-sequentially, and the data line driving circuit 96*a* supplies image signals to the data lines 6*a* at predetermined timing with consideration to timing of the supply of scanning signals.

The electro-optical apparatus also includes an opposing substrate 20 opposing the TFT array substrate 10, and a common electrode 21 is formed substantially over the opposing substrate 20. The common electrode 21 is formed of transparent conductive material, such as ITO, similarly to the pixel electrodes 9*a* described above. Furthermore, a liquid crystal layer 50, which is an example of electro-optical material, is held between the TFT array substrate 10 and the opposing substrate 20.

In the electro-optical apparatus, the TFTs 30 are controlled so as to turn on and off according to the scanning signals supplied via the scanning lines 3*a*, and image signals supplied via the data lines 6*a* can be applied to the pixel electrodes 9*a* when associated TFTs 30 are turned on (active matrix driving). When the image signals are applied to the pixel electrodes 9*a*, predetermined potential differences corresponding to the image signals are generated between the pixel electrodes 9*a* and the common electrode 21 (i.e., a predetermined potential difference is generated for each pixel). Accordingly, orientation of liquid crystal in the liquid crystal layer 50 changes and transmittance of light changes accordingly, allowing display of a corresponding image. The light incident on the liquid crystal may come from, for example, a light source provided within the electro-optical apparatus, a fluorescent lamp external to the electro-optical apparatus, etc. Since both the pixel electrodes 9*a* and the common electrode 21 are formed of transparent conductive material, this embodiment operates as what is referred to as a "transmission type."

In particular, in the electro-optical apparatus according to this embodiment, a level shifter circuit 300 is provided as part of the scanning line driving circuit 93*a*, as shown in FIG. 16. In the level shifter circuit 300, a plurality of level shifters, each being configured as described above as one of the first to fifth embodiments, is provided respectively in association with the scanning lines 3*a*. That is, in the level shifter circuit 300, one scanning line 3*a* is electrically connected to an output terminal OUT of one level shifter 100 configured, for example, as shown in FIG. 1, and another scanning line 3*a* is electrically connected to an output terminal OUT of another level shifter 100.

The scanning line driving circuit 93*a* and the data line driving circuit 96*a* may be of an integral type, i.e., integrally formed on the TFT array substrate 10 by the same manufacturing process for the TFTs 30, etc. Alternatively, the scanning line driving circuit 93*a* and the data line driving circuit 96*a* may be of an external type, i.e., implemented separately as a package that is to be mounted on the TFT array substrate 10. Both of these types are within the scope of the present invention.

Electro-optical apparatuses that use thin-film diodes (TFDs) instead of the TFTs 30 as switching elements are also known, which are also within the scope of the present invention.

The present invention is not limited to the embodiments described above, and various modifications are possible within the gist or spirit of the present invention as read from the claims and the entire specification. Level shifters and electro-optical apparatuses with such modifications are also included within the technical scope of the present invention.

What is claimed is:

1. A level shifter, comprising:

a first capacitor having a first end and a second end, a low-amplitude logic signal being input to the first end of the first capacitor;

a first offset circuit to apply a first offset voltage to the second end of the first capacitor;

a second capacitor having a first end and a second end, the low-amplitude logic signal being input to the first end of the second capacitor;

a second offset circuit to apply a second offset voltage to the second end of the second capacitor; and first and second switching elements connected in series between a supply line of a power supply voltage for a high-amplitude logic signal and a supply line of a reference voltage therefor, the first switching element being connected to the second end of the first capacitor, the second switching element being connected to the second end of the second capacitor, the first switching element being a P-channel transistor and the second switching element being an N-channel transistor, the first offset circuit being implemented by a P-channel transistor and an N-channel transistor connected in series between the supply line of the power supply voltage and the supply line of the reference voltage, a voltage at a node therebetween serving as the first offset voltage and as gate voltages of the P-channel transistor and the N-channel transistor, and the second offset circuit being implemented by a P-channel transistor and an N-channel transistor connected in series between the supply line of the power supply voltage and the, supply line of the reference voltage a voltage at a node therebetween serving as the second offset voltage and as gate voltages of the P-channel transistor and the N-channel transistor.

2. The level shifter according to claim 1, the first switching element turning on if a signal voltage at the second end of the first capacitor is not higher than a first threshold value, which is set to be lower than the first offset voltage, and the second switching element turning on if a signal voltage at the second end of the second capacitor is at or above a second threshold value, which is set to be higher than the second offset voltage.

3. The level shifter according to claim 1, the first offset circuit changing an offset value according to a n output of the level shifter, and the second offset circuit changing an offset value according to the output of the level shifter.

4. The level shifter according to claim 3, further including an initialization circuit to apply an initial voltage to the second end of the first capacitor and to the second end of the second capacitor so that the first and the second switching elements turn on and off exclusively with each other regardless of the output of the level shifter.

5. The level shifter according to claim 4, a lower voltage of the high-amplitude signal being applied to the initialization circuit as an initialization signal.

6. The level shifter according to claim 4, a higher voltage of the high-amplitude logic signal being applied to the initialization circuit as an initialization signal.

7. The level shifter according to claim 1, voltages supplied to the first offset circuit being supplied at least partially from a supply line of the low-amplitude logic signal.

8. The level shifter according to claim 1, voltages supplied to the second offset circuit being supplied at least partially from a supply line of the low-amplitude logic signal.

9. The level shifter according to claim 7, further including a power supply to supply a signal synchronized with the low-amplitude logic signal, a supply line of the synchronized signal being used instead of the supply line of the low-amplitude logic signal.

10. A level shifter, comprising:

a second capacitor having a first end and a second end, a low-amplitude logic signal being input to the first end of the second capacitor;

a second offset circuit to apply a second offset voltage to the second end of the second capacitor; and first and second switching elements connected in series between a supply line of a power supply voltage for a high-amplitude logic signal and a supply line of a reference voltage therefor, a node therebetween serving as an output terminal, the first switching element turning on when the low-amplitude logic signal is L level, and the second switching element turning on when a signal voltage at the second end of the second capacitor is at or above a second threshold voltage, which is set to be higher than the second offset voltage, the first switching element being a P-channel transistor and the second switching element being an N-channel transistor, and the second offset circuit being implemented by a P-channel transistor and an N-channel transistor connected in series between the supply line of the power supply voltage and the supply line of the reference voltage, a voltage at a node therebetween serving as the second offset voltage and as gate voltages of the P-channel transistor and the N-channel transistor.

11. A level shifter, comprising:

a first capacitor having a first end and a second end, a low-amplitude logic signal being input to the first end of the first capacitor;

a first offset circuit to apply a first offset voltage to the second end of the first capacitor; and first and second switching elements connected in series between a supply line of a power supply voltage for a high-amplitude logic signal and a supply line of a reference voltage therefor, a node therebetween serving as an output terminal, the first switching element turning on if a signal voltage at the second end of the first capacitor is at or below a first threshold voltage, which is set to be lower than the first offset voltage, and the second switching element turning on when the low-amplitude logic signal is at H level, the first switching element being a P-channel transistor and the second switching element being an N-channel transistor, and the first offset circuit being implemented by a P-channel transistor and an N-channel transistor connected in series between the supply line of the power supply voltage and the supply line of the reference voltage a voltage at a node therebetween serving as the first offset voltage and as gate voltages of the P-channel transistor and the N-channel transistor.

12. The level shifter according to claim 10, the second offset circuit changing an offset value according to an output of the level shifter.

13. The level shifter according to claim 11, the first offset circuit changing an offset value according to the output of the level shifter.

14. An electro-optical apparatus, comprising:

the level shifter according to claim 1.

15. A level shifter, comprising:

a first capacitor having a first end and a second end, a low-amplitude logic signal being input to the first end of the first capacitor;

a first offset circuit to apply a first offset voltage to the second end of the first capacitor;

a second capacitor having a first end and a second end, the low-amplitude logic signal being input to the first end of the second capacitor;

a second offset circuit to apply a second offset voltage to the second end of the second capacitor; and first and second switching elements connected in series between a supply line of a power supply voltage for a high-amplitude logic signal and a supply line of a reference voltage therefor, the first switching element being connected to the second end of the first capacitor, the second switching element being connected to the second end of the second capacitor, the first offset circuit including an N-channel transistor connected to a common drain from the first and second switching elements.

16. The level shifter according to claim 15, the first switching element turning on if a signal voltage at the second end of the first capacitor is not higher than a first threshold value, which is set to be lower than the first offset voltage, and the second switching element turning on if a signal voltage at the second end of the second capacitor is at or above a second threshold value, which is set to be higher than the second offset voltage.

17. The level shifter according to claim 15, the first switching element being a P-channel transistor and the second switching element being an N-channel transistor, the first offset circuit being implemented by a P-channel transistor and an N-channel transistor connected in series between the supply line of the power supply voltage and the supply line of the reference voltage, a voltage at a node therebetween serving as the first offset voltage and as gate voltages of the P-channel transistor and the N-channel transistor, and the second offset circuit being implemented by a P-channel transistor and an N-channel transistor connected in series between the supply line of the power supply voltage and the supply line of the reference voltage, a voltage at a node therebetween serving as the second offset voltage and as gate voltages of the P-channel transistor and the N-channel transistor.

18. The level shifter according to claim 15, the first offset circuit changing an offset value according to an output of the level shifter, and the second offset circuit changing an offset value according to the output of the level shifter.

19. The level shifter according to claim 15, voltages supplied to the first offset circuit being supplied at least partially from a supply line of the low-amplitude logic signal.

20. The level shifter according to claim 15, voltages supplied to the second offset circuit being supplied at least partially from a supply line of the low-amplitude logic signal.

21. The level shifter according to claim 19, further including a power supply to supply a signal synchronized with the low-amplitude logic signal, a supply line of the synchronized signal being used instead of the supply line of the low-amplitude logic signal.

22. A level shifter, comprising:

a first capacitor having a first end and a second end, a low-amplitude logic signal being input to the first end of the first capacitor;

a first offset circuit to apply a first offset voltage to the second end of the first capacitor;

a second capacitor having a first end and a second end, the low-amplitude logic signal being input to the first end of the second capacitor;

a second offset circuit to apply a second offset voltage to the second end of the second capacitor; and first and second switching elements connected in series between a supply line of a power supply voltage for a high-amplitude logic signal and a supply line of a reference voltage therefor, the first switching element being connected to the second end of the first capacitor, the second switching element being connected to the second end of the second capacitor, the second offset circuit including a P-channel transistor connected to a common drain from the first and second switching elements.

23. The level shifter according to claim 22, the first switching element turning on if a signal voltage at the second end of the first capacitor is not higher than a first threshold value, which is set to be lower than the first offset voltage, and the second switching element turning on if a signal voltage at the second end of the second capacitor is at or above a second threshold value, which is set to be higher than the second offset voltage.

24. The level shifter according to claim 22, the first switching element being a P-channel transistor and the second switching element being an N-channel transistor, the first offset circuit being implemented by a P-channel transistor and an N-channel transistor connected in series between the supply line of the power supply voltage and the supply line of the reference voltage, a voltage at a node therebetween serving as the first offset voltage and as gate voltages of the P-channel transistor and the N-channel transistor, and the second offset circuit being implemented by a P-channel transistor and an N-channel transistor connected in series between the supply line of the power supply voltage and the supply line of the reference voltage, a voltage at a node therebetween serving as the second offset voltage and as gate voltages of the P-channel transistor and the N-channel transistor.

25. The level shifter according to claim 22, the first offset circuit changing an offset value according to an output of the level shifter, and the second offset circuit changing an offset value according to the output of the level shifter.

26. The level shifter according to claim 22, voltages supplied to the first offset circuit being supplied at least partially from a supply line of the low-amplitude logic signal.

27. The level shifter according to claim 22, voltages supplied to the second offset circuit being supplied at least partially from a supply line of the low-amplitude logic signal.

28. The level shifter according to claim 26, further including a power supply to supply a signal synchronized with the low-amplitude logic signal, a supply line of the synchronized signal being used instead of the supply line of the low-amplitude logic signal.

29. The level shifter according to claim 1 further comprising:

a second N-channel transistor having a source connected to the supply line of the power supply voltage and a drain connected to the drains of the P-channel and N-channel transistors of first offset circuit, a third N-channel transistor having a source connected to the supply line of the power supply voltage and a drain connected to the drains of the P-channel and N-channel transistors of first offset circuit, and wherein a reset pulse is supplied to the second N-channel transistor and to the third N-channel transistor.

30. The level shifter according to claim 15 further comprising:

a second N-channel transistor having a source connected to the supply line of the power supply voltage and a drain connected to the drains of the P-channel and N-channel transistors of first offset circuit, a third N-channel transistor having a source connected to the supply line of the power supply voltage and a drain connected to the drains of the P-channel and N-channel transistors of first offset circuit, and wherein a reset pulse is supplied to the second N-channel transistor and to the third N-channel transistor.

31. The level shifter according to claim 22 further comprising:

a second N-channel transistor having a source connected to the supply line of the power supply voltage and a drain connected to the drains of the P-channel and N-channel transistors of first offset circuit, a third N-channel transistor having a source connected to the supply line of the power supply voltage and a drain connected to the drains of the P-channel and N-channel transistors of first offset circuit, and wherein a reset pulse is supplied to the second N-channel transistor and to the third N-channel transistor.

* * * * *